(12) United States Patent
Park (10) Patent No.: US 8,059,421 B2
(45) Date of Patent: Nov. 15, 2011

(54) MEMORY CARD AND METHOD OF MANUFACTURING THE SAME

(75) Inventor: Jin-Jun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1181 days.

(21) Appl. No.: 11/802,043

(22) Filed: May 18, 2007

(65) Prior Publication Data

US 2008/0080148 A1    Apr. 3, 2008

(30) Foreign Application Priority Data

Oct. 2, 2006    (KR) ........................ 10-2006-0096885

(51) Int. Cl.
*H05K 7/00*    (2006.01)
(52) U.S. Cl. ........................................ 361/760; 361/748
(58) Field of Classification Search .................. 361/760, 361/748
See application file for complete search history.

(56) References Cited

U.S. PATENT DOCUMENTS

| | | | | |
|---|---|---|---|---|
| 4,663,208 | A * | 5/1987 | Ninomiya et al. | 428/138 |
| 6,229,249 | B1 * | 5/2001 | Hatanaka et al. | 310/348 |
| 2005/0037647 | A1 | 2/2005 | Le | |
| 2005/0086433 | A1 * | 4/2005 | Okaue et al. | 711/115 |
| 2005/0251593 | A1 * | 11/2005 | Lin et al. | 710/62 |
| 2006/0118641 | A1 | 6/2006 | Hwang et al. | |

FOREIGN PATENT DOCUMENTS

| | | |
|---|---|---|
| KR | 10-2006-0064291 | 6/2006 |
| KR | 10-2006-0081703 | 7/2006 |

\* cited by examiner

*Primary Examiner* — Nabil El Hady
*Assistant Examiner* — Abiy Getachew
(74) *Attorney, Agent, or Firm* — Lee & Morse (57) ABSTRACT

Example embodiments relate to a memory card including a generally box-shaped printed circuit board, a control chip in the generally box-shaped printed circuit board, a memory chip in the generally box-shaped printed circuit board, and a plurality of contact pads on at least two portions of an upper portion, a lower portion, a left portion and a right portion of a front face of the generally box-shaped printed circuit board, and on at least two portions of an upper portion, a lower portion, a left portion and a right portion of a rear face of the generally box-shaped printed circuit board.

20 Claims, 8 Drawing Sheets

MEMORY CARD AND METHOD OF MANUFACTURING THE SAME

BACKGROUND OF THE INVENTION

1. Field of the Invention

Example embodiments relate to a memory card and a method of manufacturing the same.

2. Description of the Related Art

As peripheral devices, i.e., a computer, a cellular phone, a digital device (i.e., camera), are being rapidly developed, there may be a need for larger storage capacity. Therefore, a memory card used as a storage medium in peripheral devices may be quickly improving, e.g., memory cards having gigabytes for storage capacity.

However, configurations of the memory cards, such as size, number and location of the contact pads, may vary in accordance with the different types of peripheral devices. Thus, one type of peripheral device, e.g., a computer, a cellular phone, and/or a digital camera, may not be compatible with other types of peripheral devices.

Accordingly, because conventional memory cards may not be compatible with more than one peripheral device, separate memory cards may be required for each peripheral device.

SUMMARY OF THE INVENTION

Example embodiments are therefore directed to a memory card, which substantially overcome one or more of the problems due to the limitations and disadvantages of the related art.

It is therefore a feature of the example embodiments to provide a memory card that may be readily applicable for different type of devices.

At least one of the above and other features of example embodiments may provide a memory card having a generally box-shaped printed circuit board, a control chip in the generally box-shaped printed circuit board, a memory chip in the generally box-shaped printed circuit board, and a plurality of contact pads on at least two portions of an upper portion, a lower portion, a left portion and a right portion of a front face of the generally box-shaped printed circuit board, and on at least two portions of an upper portion, a lower portion, a left portion and a right portion of a rear face of the generally box-shaped printed circuit board.

At least one of the above and other features of example embodiments may provide a method of manufacturing a memory card. The method may include forming a generally box-shaped printed circuit board, disposing a control chip in the generally box-shaped printed circuit board, disposing a memory chip in the generally box-shaped printed circuit board and providing a plurality of contact pads on at least two portions of an upper portion, a lower portion, a left portion and a right portion of a front face of the generally box-shaped printed circuit board, and on at least two portions of an upper portion, a lower portion, a left portion and a right portion of a rear face of the generally box-shaped printed circuit board.

At least one of the above and other features of example embodiments may provide a method of manufacturing a memory card. The method may include preparing a printed circuit board having a plurality of contact pads, preparing a package member that may include a control chip having convertible functions, a memory chip that may store data, a wire for connecting the control chip to the memory chip, and a molding member that may support the control chip, the memory chip and the wire, placing the package member on a face of the printed circuit board that may be on an opposite side where the contact pads are formed, and forming the printed circuit board into a generally box shape, the contact pads being placed on at least two portions of an upper portion, a lower portion, a left portion and a right portion of a front face of the generally box-shaped printed circuit board, and on at least two portions of an upper portion, a lower portion, a left portion and a right portion of a rear face of the generally box-shaped printed circuit board, the package member may be positioned in the generally box-shaped printed circuit board.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 2006-96885 filed on Oct. 2, 2006 in the Korean Intellectual Property Office, and entitled: "Memory Card and Method of Manufacturing the Same," is incorporated by reference herein in its entirety.

Example embodiments will now be described more fully hereinafter with reference to the accompanying drawings. Example embodiments may, however, be embodied in different forms and should not be construed as limited to the embodiments set forth herein. Rather, these example embodiments are provided so that this disclosure will be thorough and complete, and will fully convey the scope of the invention to those skilled in the art.

Memory Card

Figure 1:
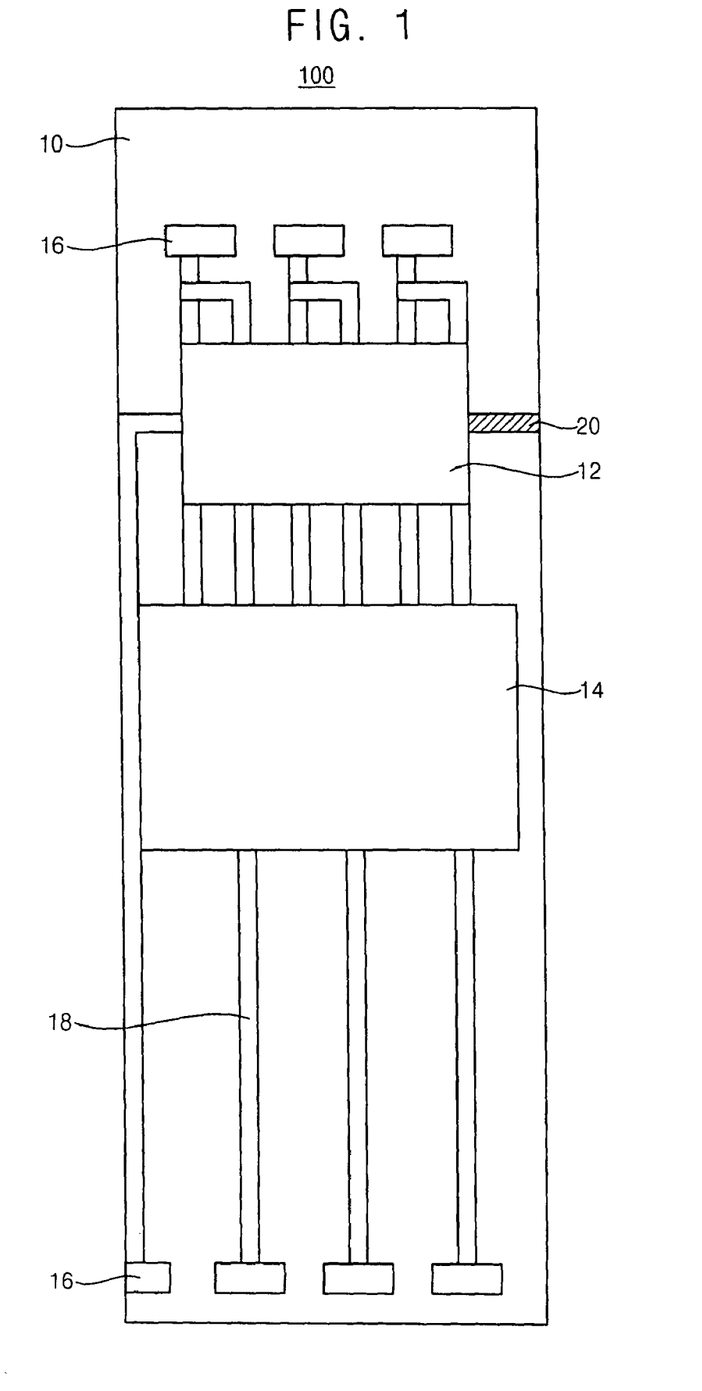
FIG. 1 illustrates a plan view of a memory card in accordance with an example embodiment.
Figure 2:
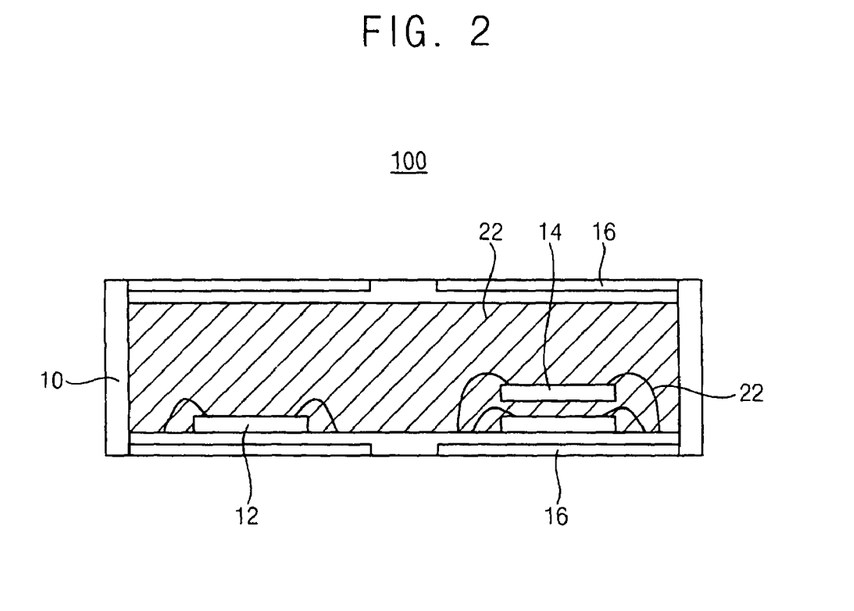
FIG. 2 illustrates a cross-sectional view of the memory card in FIG. 1.

FIG. 1 illustrates a plan view of a memory card in accordance with an example embodiment; FIG. 2 illustrates a cross-sectional view of the memory card in FIG. 1; and FIGS. 3 to 6 illustrate diverse variations of contact pads on the memory card in FIGS. 1 and 2;

Referring to FIGS. 1 and 2, a memory card 100 in accordance with this example embodiment may include a printed circuit board (PCB) 10. In an example embodiment, the PCB 10 may be formed, e.g., bent, into a generally box shape to form the memory card 100. It should be appreciated by one skilled in the art that other shapes may be employed to form the PCB 10.

A control chip 12 having convertible functions may be disposed in the PCB 10. A memory chip 14 for storing data, for example, may also be disposed in the PCB 10. The control chip 12 may include a microprocessor, i.e., a flash memory. Further, in order to increase storage capacity of the memory chip 14, at least two memory chips 14 may be disposed in the PCB 10. It should be appreciated that there may be more than two memory chips 14 disposed in the PCB 10 to increase storage capacity. When at least two memory chips 14 are formed in the PCB 10, the memory chips 14 may be in a stacked configuration, for example. It should be appreciated that the memory chips 14 may also be arranged in other configurations, e.g., side-by-side. Further, the memory card 100 may include a driver for driving the memory card 100, e.g., an interface for transmitting signals. One skilled in the art should appreciate that the memory card 100 may include other elements and/or devices.

Contact pads 16 may be formed on at least two portions, e.g., an upper portion, a lower portion, a left portion and a right portion, of a front face of the generally box-shaped memory card 100, and formed on at least two portions, e.g., an upper portion, a lower portion, a left portion and a right portion, of a rear face of the generally box-shaped memory card 100.

Figure 3:
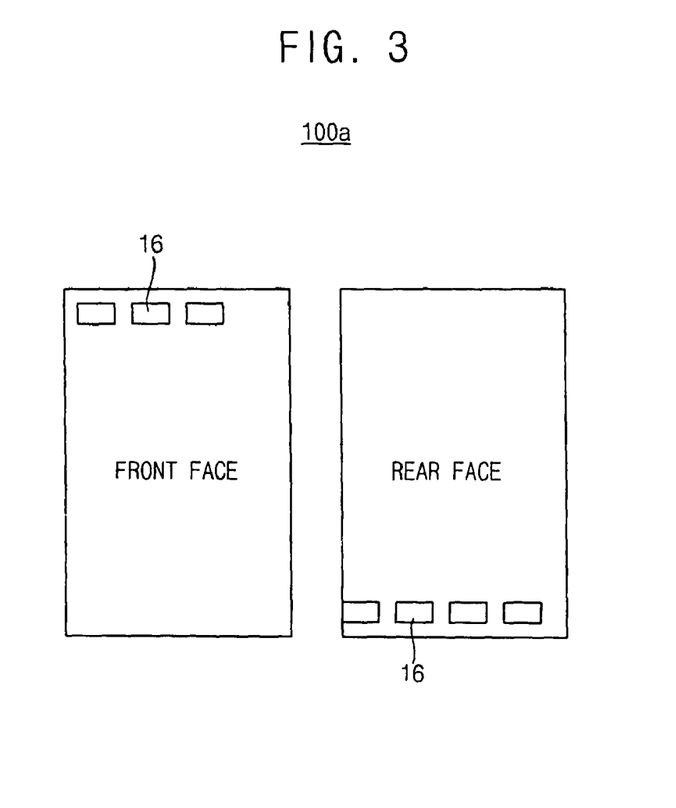
FIGS. 3 to 6 illustrate different variations of contact pads on the memory card in FIGS. 1 and 2.

As shown in FIG. 3, the contact pads 16 may be formed on the upper portion of the front face and the lower portion of the rear face in a memory card 100*a*. It should be appreciated that the contact pads 16 may also be formed at other locations of the memory card 100*a*. Moreover, the number of contact pads 16 on the upper portion of the front face may be different from that of the contact pads 16 on the lower portion of the rear face so that the memory card 100*a* may be compatible with other devices. For example, the memory card 100*a* of FIG. 3 may be compatible with a cellular phone and a digital camera, e.g., three of the contact pads 16 on the upper portion of the front face may be applied to the cellular phone, and four of the contact pads 16 on the lower portion of the rear face may be applied to the digital camera. One skilled in the art should appreciate that there may be more or less contact pads 16 on the memory card 100*a* depending on the intended device.

Figure 4:
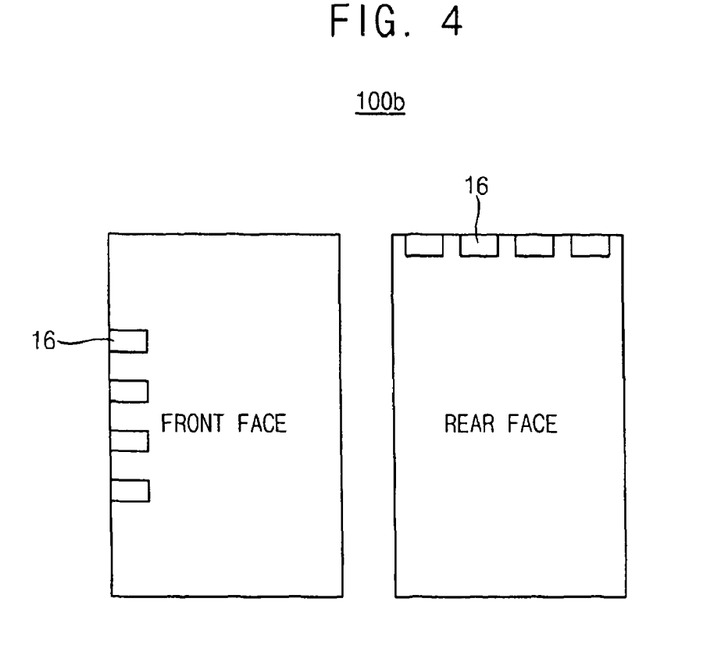

As shown in FIG. 4, the contact pads 16 may be formed on the left portion of the front face and the upper portion of the rear face in a memory card 100*b*. Further, although FIG. 4 illustrates four contact pads 16 on the left portion of the front face and four contact pads 16 on the upper portion of the rear face, it should be appreciated that the number of contact pads 16 on the left portion of the front face may be different from that of the contact pads 16 on the upper portion of the rear face. Furthermore, when the generally box-shaped memory card 100*b* may have a rectangular parallelepiped shape, for example, the rectangular parallelepiped memory card 100*b* may have a width and a length which may be different from each other. Thus, when a size of the memory card 100*b* applied to the cellular phone is different from that of the memory card 100*b* applied to the digital camera, the memory card 100*b* in FIG. 4 may be compatible with the cellular phone and/or the digital camera. For example, the relatively large and long contact pads 16 on the left portion of the front face may be applied to the cellular phone, and the relatively small and short contact pads 16 on the upper portion of the rear face may be applied to the digital camera.

Figure 5:
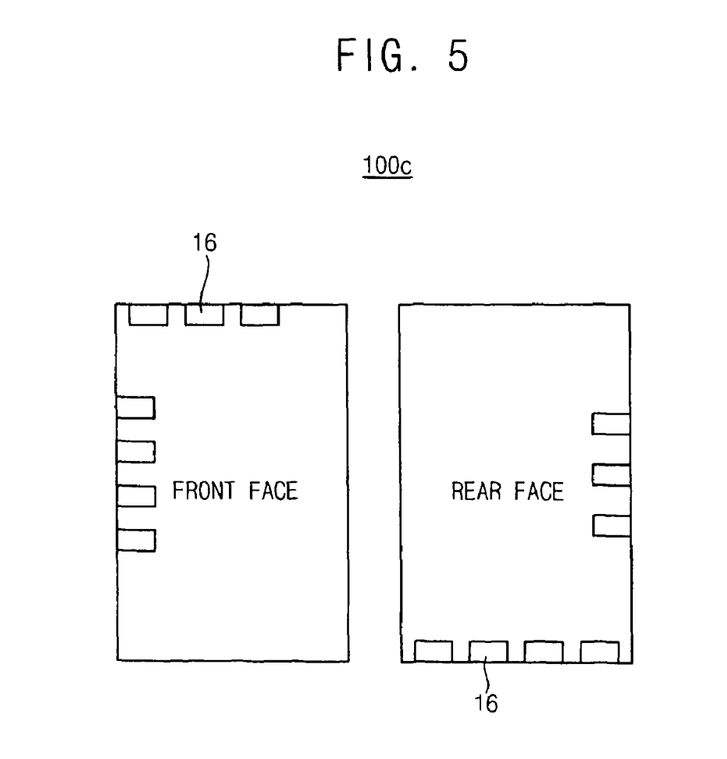

Referring to FIG. 5, the contact pads 16 may be formed on four portions, e.g., the upper portion and the left portion of the front face, and the lower portion and the right portion of the rear face, of a memory card 100*c*.

Figure 6:
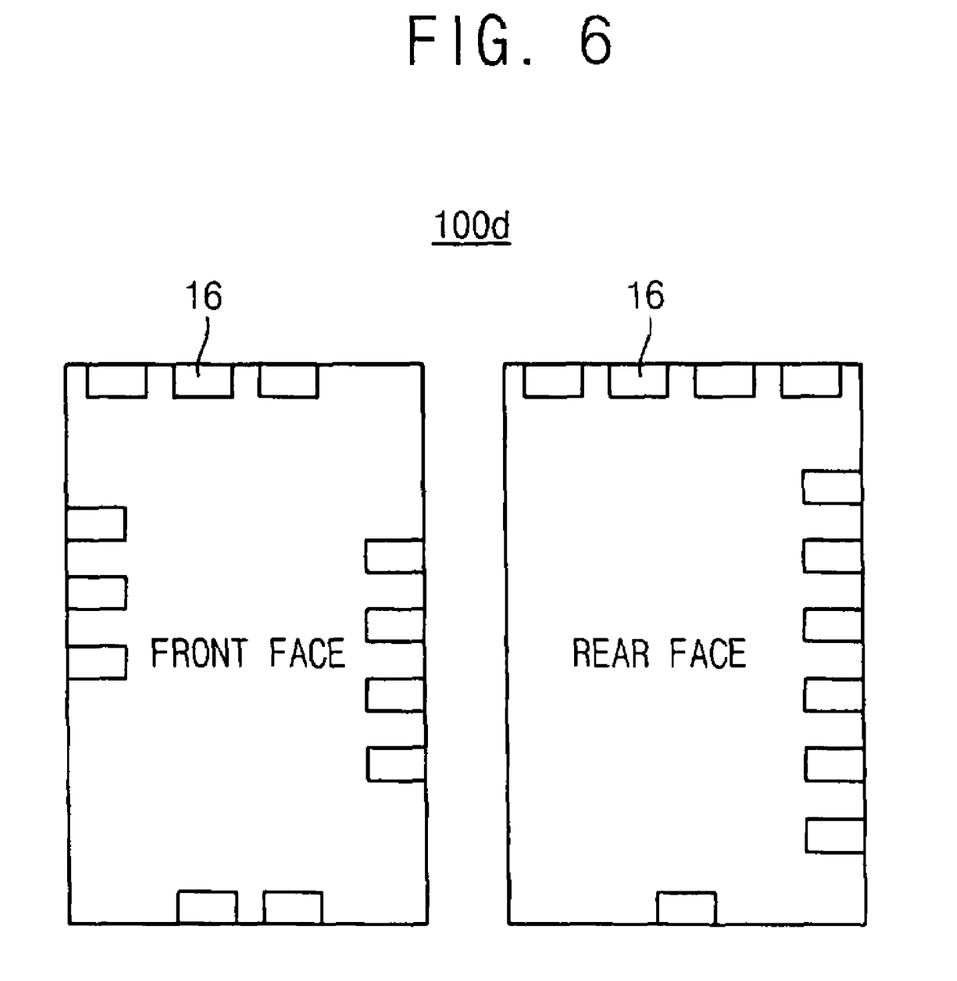

Referring to FIG. 6, the contact pads 16 may be formed on eight portions, e.g., the upper portion, the lower portion, the left portion and the right portion of the front face, and the upper portion, the lower portion, the left portion and the right portion of the rear face, of a memory card 100*d*.

Accordingly, the memory card 100*c* in FIG. 5 may be compatible with four kinds of digital devices; and the memory card 100*d* in FIG. 6 may be compatible with eight kinds of digital devices.

The above example embodiments are for illustration purposes only, and one skilled in the art should appreciate that other configurations and/or layouts of the contact pads 16, including location, number and/or size of the contact pads may be employed on the memory card 100.

The control chip 12 and the memory chip 14 may be electrically connected to each other via a wire 18. Further, the wire 18 may connect the control chip 12 and the memory chip 14 to the contact pads 16 in the generally box-shaped PCB 10.

A molding member 22 may be formed in the generally box-shaped PCB 10 to support the control chip 12, the memory chip 14 and the wire 18 (as shown in FIG. 2).

Further, the memory card 100 may include a converting member 20 connected to the control chip 12. The converting member 20 may convert functions of the control chips 12 by an outside operation of the PCB 10. Accordingly, the memory card 100 may be readily applied to digital devices, such as, but not limited to, a cellular phone, a computer, and/or a digital device, by properly handling the converting member 20. That is, when the memory card 100 is applied to the cellular phone, the converting member 20 may interface with the control chip 12 to recognize the memory card 100 as the cellular phone; and when the memory card 100 is applied to the digital camera, the converting member 20 may interface with the control chip 12 to recognize the memory card 100 as the digital camera.

In an example embodiment, the control chip 12 may be illustrated as a single chip, and the convertible functions thereof may be communicated through the converting member 20. That is, the single control chip 12 may have various functions communicated via the converting member 20.

Figure 7:
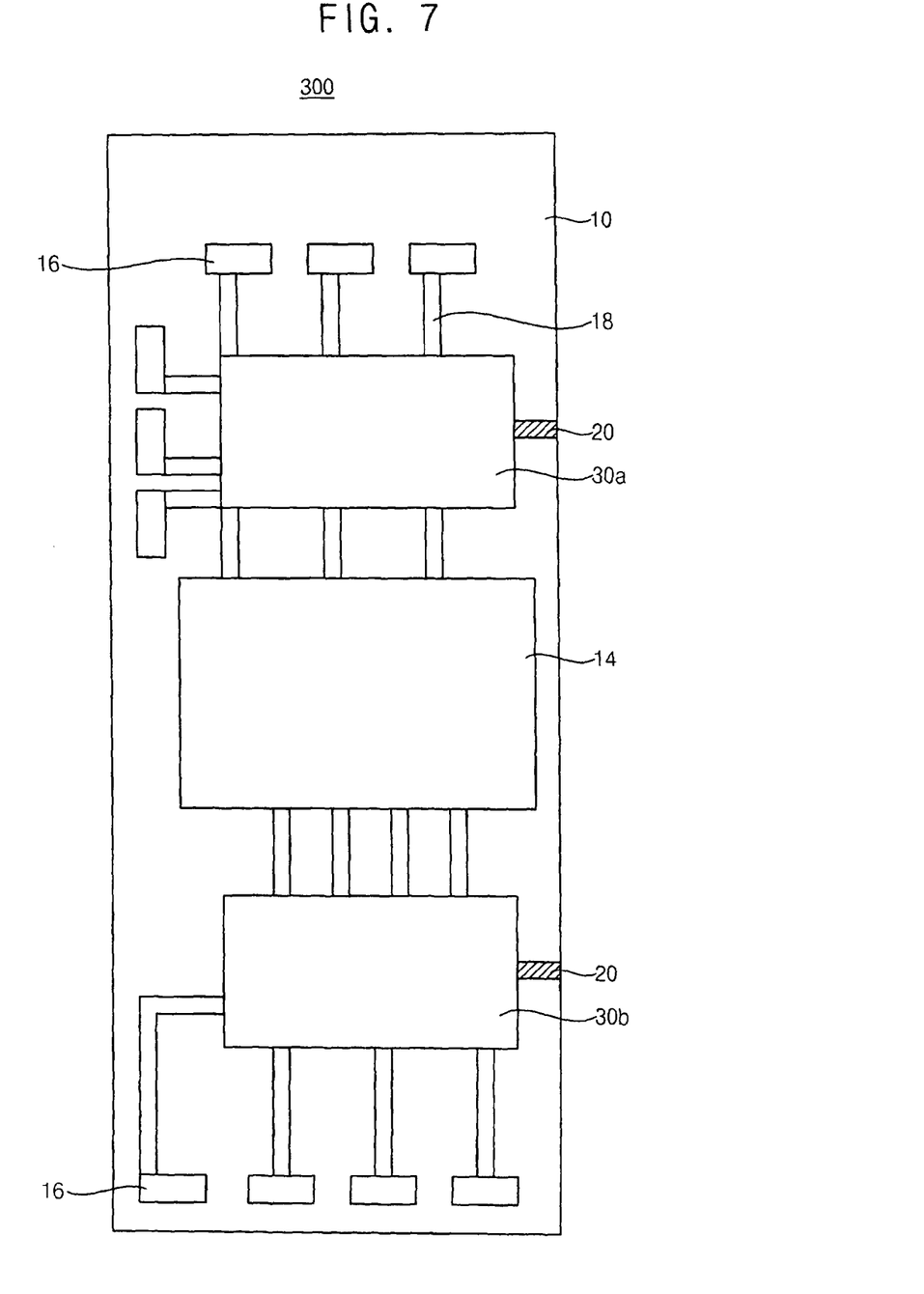
FIG. 7 illustrates a plan view of a memory card in accordance with another example embodiment.
Figure 8:
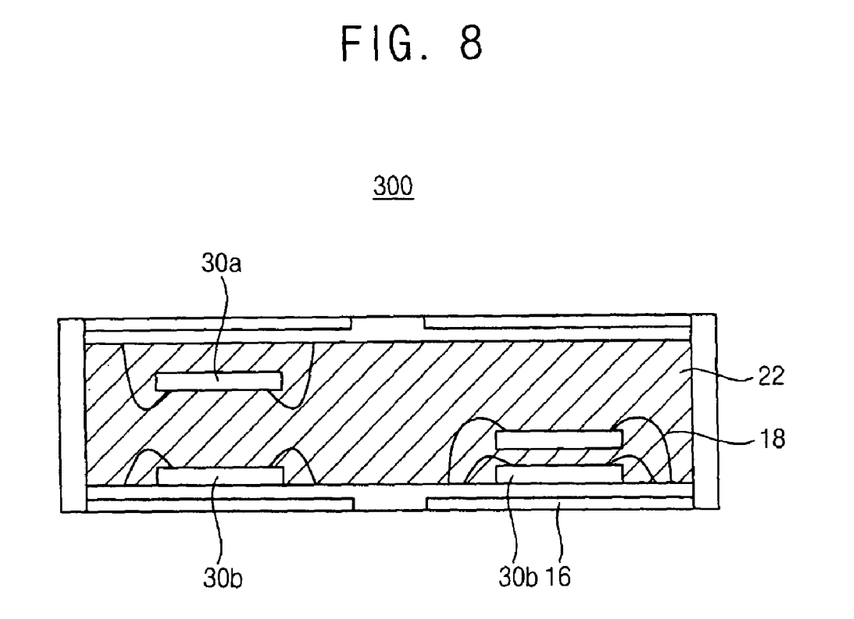
FIG. 8 illustrates a cross-sectional view of the memory card in FIG. 7.

Referring to FIGS. 7 and 8, a memory card 300 may include at least two control chips 30*a* and 30*b*. It should be appreciated that more than two control chips may be included in the memory card 300. When the memory card 300 includes the first control chip 30*a* and the second control chip 30*b*, the first and second control chips 30*a* and 30*b* may have functions different from each other. For example, the first control chip 30*a* may be used for applying the memory card 300 to a cellular phone; and the second control chip 30*b* may be used for applying the memory card 300 to a digital camera. Therefore, in this example embodiment (as shown in FIGS. 7 and 8), the number of the first and second control chips 30*a* and 30*b* may be dependent upon that of the contact pads 16. For example, when the contact pads 16 are formed on two portions of the memory card 300, two control chips may be provided to the memory card 300. Further, when the contact pads 16 are formed on four portions of the memory card 300, four control chips may be provided to the memory card 300. Accordingly, the first control chip 30*a* and second control chip 30*b* may have functions different from one another. Further, the first control chip 30*a* and the second control chip 30*b* may be arranged in a stacked configuration according to an integration function of the memory card 300.

As further illustrated in FIGS. 7 and 8, the converting member 20 for converting functions of each of the first and second control chips 30*a* and 30*b* may be connected to at least the first and second control chips 30*a* and 30*b*. That is, the first and second control chips 30*a* and 30*b* having certain functions may be selected via the converting member 20, e.g., when only the first control chip 30*a* is used in the memory card 100 including the first and second control chips 30a and 30b, only the first control chip 30a may be operated by the converting member 20.

According to example embodiments, the contact pads 16 may be formed on at least two portions of the memory card 300 so that the control chips 30a or 30b may have various functions (or the appropriate control chips therein may be selected). As a result, the memory card may be readily compatible with digital devices requiring different sizes, numbers of the contact pads, e.g., the memory card may be compatible with computers, cellular phones, and/or digital cameras, etc.

Hereinafter, a method of manufacturing the above-mentioned memory card in accordance with an example embodiment is illustrated in detail.

Method of Manufacturing a Memory Card

FIGS. 9A to 9D illustrate cross-sectional views of stages in a method of manufacturing a memory card in accordance with another example embodiment.

Here, the same reference numerals refer to the same elements of the above-mentioned memory card 100.

Figure 9A:
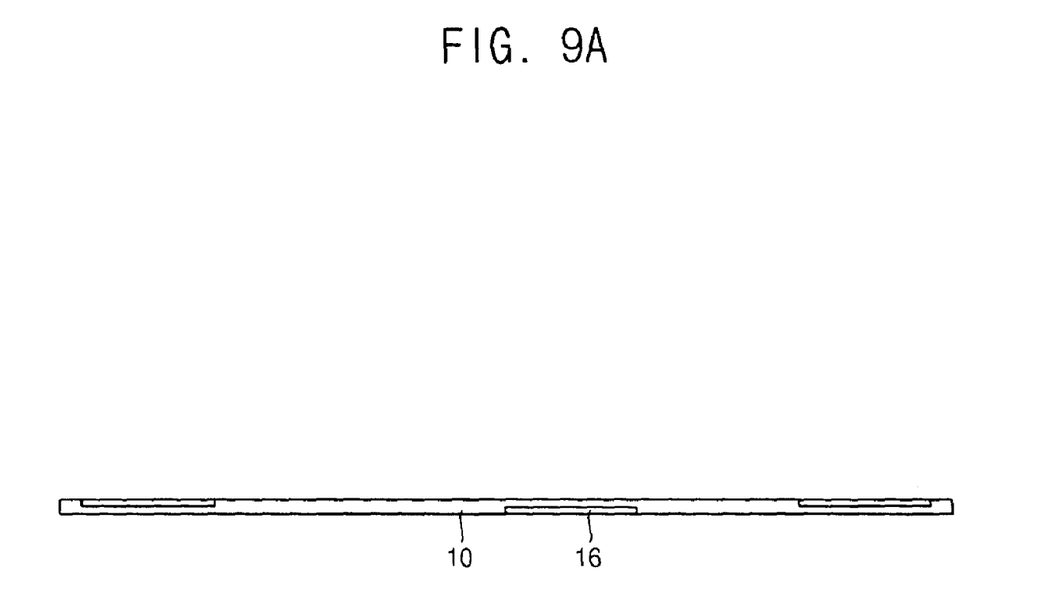
FIGS. 9A to 9D illustrate cross-sectional views of stages in a method of manufacturing a memory card in accordance with another example embodiment.

Referring to FIG. 9A, the contact pads 16 may be formed on the front face and the rear face of the PCB 10. When the PCB 10 is formed into the generally box shape, the contact pads 16 may be positioned on at least two portions of the memory card 100, e.g., the upper portion, the lower portion, the left portion and the right portion of the front face, and on at least two portions of the memory card 100, e.g., the upper portion, the lower portion, the left portion and the right portion of the rear face. Further, the contact pads 16 may be readily formed in accordance with a design of the PCB 10.

Figure 9B:
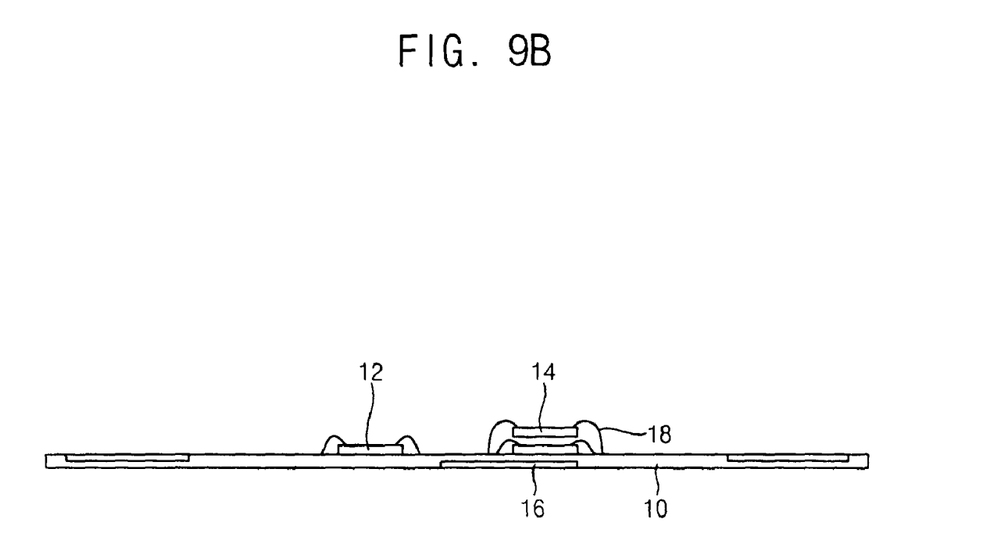

Referring to FIG. 9B, the control chip 12 having convertible functions and the memory chip 14 storing data may be formed on a face of the PCB 10 opposite to where the contact pad 16 may be formed. That is, the control chip 12 and the memory chip 14 may be placed on the PCB 10. Further, the memory chip 14 may include at least two memory chips 14 that may be stacked in accordance with an integration function of the memory card 100.

The control chip 12 and the memory chip 14 may then be electrically connected to each other using a wire 18, for example. It should be appreciated that other methods may be employed to connect the control chip 12 and the memory chip 14. Further, the memory chip 14 may be electrically connected to the contact pads 16 via wire 18. The converting member (not shown) may be electrically connected to the control chip 12. In an example embodiment, when the PCB 10 is formed, e.g., bent, into the generally box shape, the converting member may be located at an outside of the PCB 10 so as to allow the converting member to be handled by an outside operation.

Figure 9C:
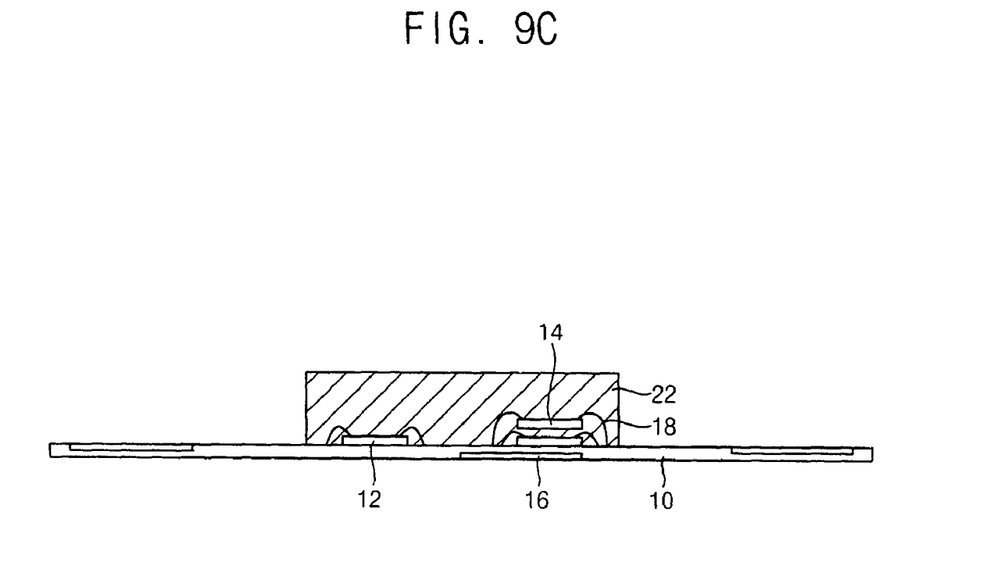

Referring to FIG. 9C, after the control chip 12, the memory chip 14 and the wire 18 may be formed, the molding member 22 may then cover the control chip 12, the memory chip 14 and the wire 18 to firmly fix the control chip 12, the memory chip 14 and the wire 18 thereof.

Figure 9D:
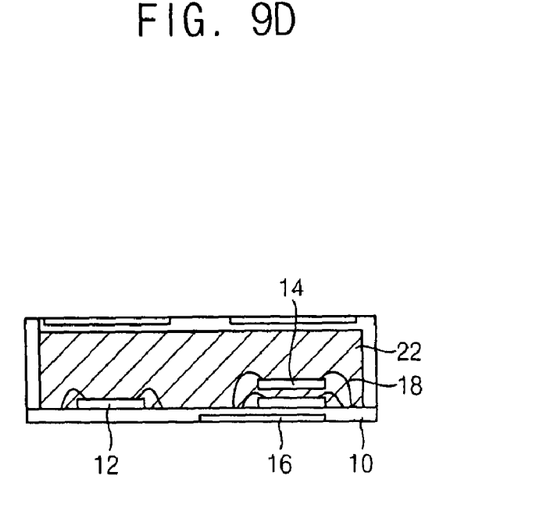

Referring to FIG. 9D, the PCB 10 may be formed into the generally box shape, thereby completing the memory card 100, which may include the contact pads 16 on at least the two portions of the memory card 100, the control chip 12, the memory chip 14 and the wire 18.

Figure 10:
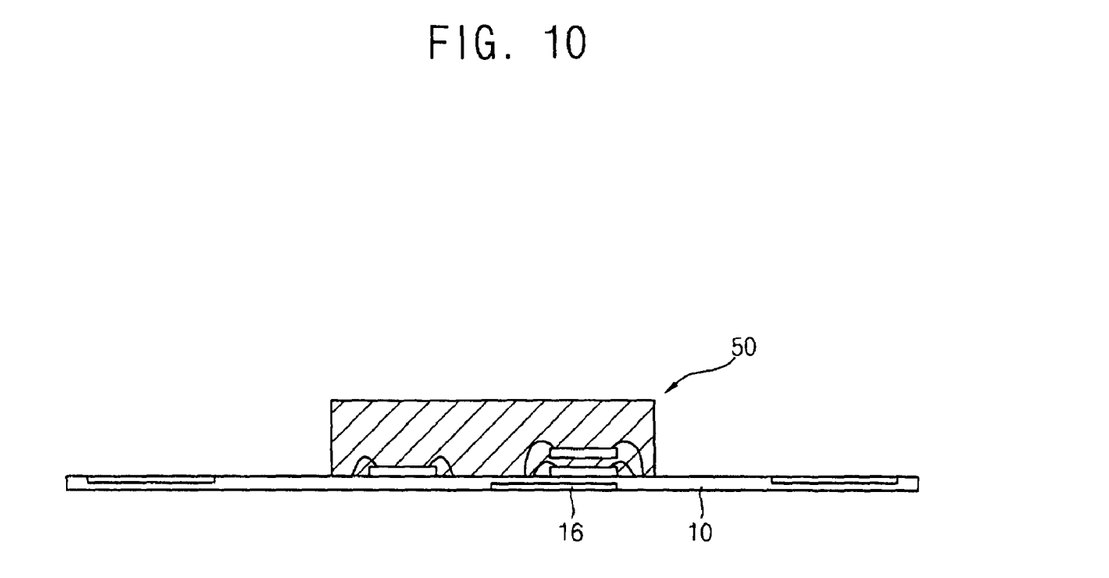
FIG. 10 illustrates a cross-sectional view of a method of manufacturing a memory card in accordance with another example embodiment.

As illustrated in FIG. 10, a package member 50 may be used so as to mold the control chip 12, the memory chip 14 and the wire 18 into the package member 50. That is, after the PCB 10 is prepared, the package member 50 may be formed on the PCB 10. The PCB 10 may be formed into the generally box shape to compose the memory card 100.

According to example embodiments, the memory card 100 may include contact pads 16 on at least two portions of the memory card 100, and may include control chips 12 that may have various functions that may be readily selected. Thus, the memory card 100 may be compatible with different digital devices, e.g., devices requiring different sizes, different number of contact pads and/or different locations of contact pad, by appropriately designing the contact pads 16 and the control chips 12.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A memory card, comprising:
a generally box-shaped printed circuit board;
a control chip in the generally box-shaped printed circuit board;
a memory chip in the generally box-shaped printed circuit board; and
a plurality of contact pads on at least two portions of an upper portion, a lower portion, a left portion and a right portion of a front face of the generally box-shaped printed circuit board, and an upper portion, a lower portion, a left portion and a right portion of a rear face of the generally box-shaped printed circuit board;
wherein a contact pad in a first portion of the at least two portions is configured for application to a first type of peripheral device, and
a contact pad in a second portion of the at least two portions is configured for application to a second type of peripheral device, the second type of peripheral device being different from the first type of peripheral device.

2. The memory card as claimed in claim 1, further comprising a wire connected between the control chip and the memory chip.

3. The memory card as claimed in claim 1, wherein a number of the contact pads on the front face of the generally box-shaped printed circuit board is different than a number of the contact pads on the rear face of the generally box-shaped printed circuit board.

4. The memory card as claimed in claim 1, wherein a size of the contact pads on the front face of the generally box-shaped printed circuit board is different than a size of the contact pads on the rear face of the generally box-shaped printed circuit board.

5. The memory card as claimed in claim 2, further comprising a molding member formed in the generally box-shaped printed circuit board to support the control chip, the memory chip and the wire.

6. The memory card as claimed in claim 1, further comprising a converting member connected to the control chip to convert the functions of the control chip, the converting member being located at an outside of the generally box-shaped printed circuit board to be handled by an outside operation.

7. The memory card as claimed in claim 1, wherein a number of the control chips is at least two, and the at least two control chips have functions different from each other.

8. The memory card as claimed in claim 7, wherein the control chips are arranged in a stacked configuration.

9. The memory card as claimed in claim 1, wherein a number of the memory chips is at least two.

10. The memory card as claimed in claim 9, wherein the memory chips are arranged in a stacked configuration.

11. A method of manufacturing a memory card, comprising:
forming a generally box-shaped printed circuit board;
disposing a control chip in the generally box-shaped printed circuit board;
disposing a memory chip in the generally box-shaped printed circuit board; and
providing a plurality of contact pads on at least two portions of an upper portion, a lower portion, a left portion and a right portion of a front face of the generally box-shaped printed circuit board, and an upper portion, a lower portion, a left portion and a right portion of a rear face of the generally box-shaped printed circuit board;
wherein a contact pad in a first portion of the at least two portions is configured for application to a first type of peripheral device, and
a contact pad in a second portion of the at least two portions is configured for application to a second type of peripheral device, the second type of peripheral device being different from the first type of peripheral device.

12. The method as claimed in claim 11, further comprising electrically connecting the control chip and the memory chip using a wire.

13. The method as claimed in claim 11, wherein a number of the contact pads on the front face of the generally box-shaped printed circuit board is different than a number of the contact pads on the rear face of the generally box-shaped printed circuit board.

14. The method as claimed in claim 11, wherein a size of the contact pads on the front face of the generally box-shaped printed circuit board is different than a size of the contact pads on the rear face of the generally box-shaped printed circuit board.

15. The memory card as claimed in claim 12, further comprising forming a molding member in the box-shaped printed circuit board to support the control chip, the memory chip and the wire.

16. The method as claimed in claim 11, further comprising connecting a converting member to the control chip to convert functions of the control chip, the converting member being located at an outside of the generally box-shaped printed circuit board to be handled by an outside operation.

17. The method as claimed in claim 11, wherein the control chip includes convertible functions and the memory chip stores data, and the control chip and the memory chip are disposed on a face of the generally box-shaped printed circuit board and on an opposite side where the contact pads are formed.

18. The memory card as claimed in claim 1, wherein the first and second portions are on the front face.

19. The memory card as claimed in claim 18, further comprising a contact pad on a third portion on the rear face, the contact pad on the third portion being configured for application to a third type of peripheral device.

20. The memory card as claimed in claim 1, wherein the first portion is on the front face and the second portion is on the rear face.

* * * * *